United States Patent [19]

Darrow

[11] 4,001,710
[45] Jan. 4, 1977

[54] FAIL-SAFE ACTIVE BAND-PASS FILTER

[75] Inventor: John O. G. Darrow, Murrysville, Pa.

[73] Assignee: Westinghouse Air Brake Company, Swissvale, Pa.

[22] Filed: May 27, 1975

[21] Appl. No.: 581,221

[52] U.S. Cl. .................................. 330/31; 330/21; 330/109; 333/75

[51] Int. Cl.$^2$ ........................................ H03F 3/04

[58] Field of Search ............. 330/21, 31, 107, 109; 333/75

[56] References Cited

UNITED STATES PATENTS

| | | | |
|---|---|---|---|
| 2,245,365 | 6/1941 | Riddle | 333/75 X |
| 2,593,600 | 4/1952 | Pike | 330/109 X |
| 3,411,098 | 11/1968 | Perra | 333/75 X |
| 3,725,802 | 4/1973 | Darrow | 330/31 |

*Primary Examiner*—Robert Segal
*Assistant Examiner*—Lawrence J. Dahl
*Attorney, Agent, or Firm*—J. B. Sotak; R. W. McIntire, Jr.

[57] ABSTRACT

This disclosure relates to an improved fail-safe electronic filter circuit including a common-emitter transistor amplifier having a feedback path. The feedback path includes an R-C twin-T network which is imperfectly nulled to only provide regeneration at a preselected frequency. An emitter-follower circuit operates to isolate the series resistance branch of the R-C twin-T network from the collector of the transistor amplifier so that an output signal is only available during the presence of a signal having the preselected frequency and in the absence of a critical component or circuit failure.

8 Claims, 1 Drawing Figure

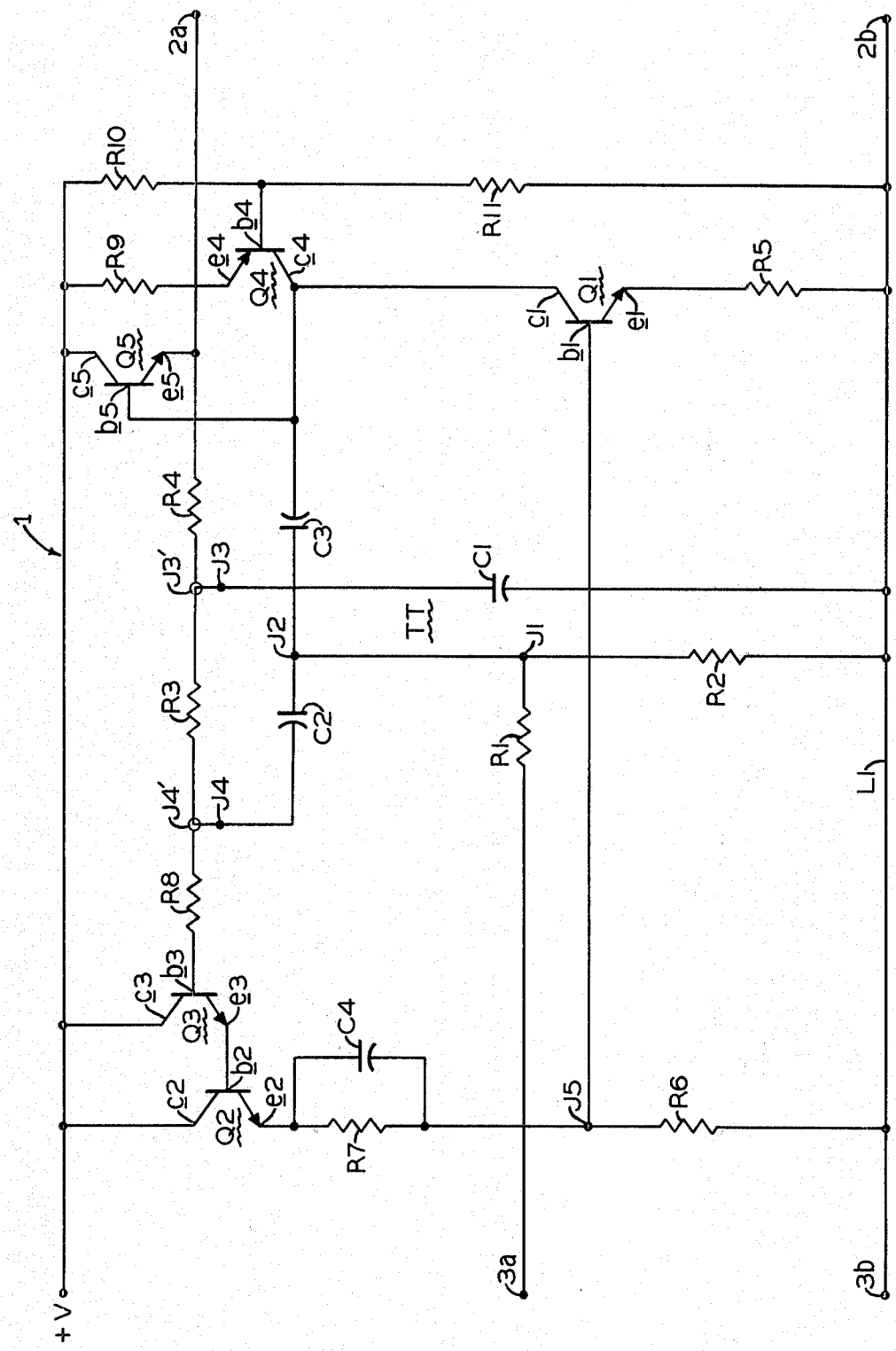

FAIL-SAFE ACTIVE BAND-PASS FILTER

My invention relates to an improved fail-safe electronic band-pass filter and more particularly to a low frequency selective amplifier circuit having a feedback loop including an R-C twin-T network which is imperfectly nulled to a particular frequency and having an emitter follower for isolating the series resistance branch of the R-C twin-T network from the load of the selective amplifier circuit so that an output signal is produced when and only when an input signal having the particular frequency is present and no critical component or circuit failure exists.

In the past, passive types of tuned L-C networks were extensively employed as band-pass filters for selecting the particular frequency of an incoming signal which represented the authorized speed command of a moving vehicle in, for example, mass and/or rapid transit operations. These passive types of tuned networks are generally acceptable and operate satisfactorily when employed in high frequency signal applications. However, when the frequencies of the speed command signals approach the lower end of the electromagnetic spectrum, the L-C networks become expensive in cost, bulky in size, and heavy in weight. Thus, each of these factors detracts for any intended use of L-C networks in speed control systems utilizing low frequency command signals. While various approaches have been made in an attempt to solve this low frequency problem, none of these previous endeavors have been comletely successful in all respects demanded by vital types of speed control systems. For example, while prior types of electronic filters were relatively inexpensively small and lightweight and were acceptable for nonvital types of applications, these previous filters are wholly unacceptable for use in mass and/or rapid transit systems in that a component or circuit failure could result in an unsafe condition. For example, prior types of electronic filter circuits generally employed negative feedback which could result in an unsafe failure if and when degeneration is lost due to opening of the feedback loop since the active element becomes a high gain stage for all signal frequencies. In speed control systems, it is of utmost importance to exercise extreme care in designing and constructing filtering circuits in order to preclude injury to persons and to prevent damage to the equipment. That is, in order to insure the highest degree of safety to individuals as well as to apparatus, it is necessary and essential that under no circumstances should a failure cause or be capable of simulating a true or valid indication. Accordingly, it is readily evident that the filtering circuits, like every other portion of the speed control system, must operate in a fail-safe manner so that any conceivable failure will result in a condition at least as restrictive and preferably more restrictive than that preceding the failure. For example, when a circuit malfunction or component failure occurs in the filter, it is required that no output be produced during the presence of a false input or presence of an input of another frequency, and it is also mandatory that no output be produced during the absence of an input. Thus, it will be appreciated that an acceptable filtering circuit must operate in a fail-safe manner so that the integrity and security of the speed control system is maintained at all times, and then and only then can all eminently hazardous and dangerous conditions be avoided. A highly reliable electronic filtering circuit is shown and described in my U.S. Pat. No. 3,725,802, and this invention is an improvement thereof.

Accordingly, it is an object of my invention to provide a new and improved fail-safe electronic filter circuit.

Another object of my invention is to provide an improved fail-safe active band-pass filter employing a common-emitter and an emitter-follower amplifier circuit having a feedback loop which includes a parallel-T network.

A further object of my invention is to provide an enhanced fail-safe type of transistorized filter for passing a signal having a preselected frequency and for blocking signals having all other frequencies.

Yet another object of my invention is to provide an advanced fail-safe solid-state amplifier filter employing an R-C twin-T network which is imperfectly nulled to provide positive feedback at a preselected frequency and having means for disassociating the series connected resistors of the R-C twin-T network from the load of the amplifier to prevent an increase in gain and to preclude spurious oscillations from occurring due to poor solder connections.

Yet a further object of my invention is to provide an improved positive feedback common-emitter transistor amplifier employing a frequency R-C twin-T selective network and having a common-collector amplifier for effectively isolating the series resistive branch of the R-C twin-T from the collector of the common-emitter transistor amplifier for causing an output signal to be produced only during the presence of an input signal having a preselected frequency and in the absence of a critical component or circuit failure.

Still another object of my invention is to provide an improved electronic band-pass filter circuit which operates in a fail-safe manner.

Still a further object of my invention is to provide a unique fail-safe active filter circuit which is light in weight and small in size.

Still yet another object of my invention is to provide a new and improved electronic filter which is economical in cost, simple in construction, reliable in operation, durable in use and efficient in service.

Briefly, my invention relates to an active type of fail-safe low frequency band-pass filter including a common-emitter transistor amplifier circuit having a gain greater than unity and having a feedback circuit extending from the collector to the base electrodes of the transistor. The feedback circuit includes a parallel-T network and a Darlington amplifier circuit. The parallel-T network is an unbalanced symmetrical circuit made up of a plurality of resistors and capacitors which provide a 180° phase shift at one preselected signal frequency. The Darlington circuit includes a pair of transistors connected in an emitter-follower configuration so that no signal inversion occurs and so that less than unity gain is produced. The attenuation of the parallel-T network along with the less than unity gain as well as the inherent losses occurring in the emitter-follower Darlington circuit offset the gain of the transistor amplifier circuit so that unwanted spurious oscillations cannot be produced during the absence of a signal having the preselected frequency. The unbalancing effect causes the parallel-T network to be imperfectly nulled at the preselected frequency and ensures that all other signal frequencies are not phase inverted and therefore degeneration occurs at the other signal frequencies. An emitter-follower amplifier operates to isolate the series resistor branch of the parallel-T network from the collector load impedance of the common-emitter transistor amplifier whose collector electrode is supplied by a source of constant current so that the gain of the amplifier is determined by the impedance of the series capacitor section of the parallel twin-T network and is incapable of accidentally increasing. A relatively high input impedance and its particular circuit connection insures that substantial signal losses will occur to any input signal during a critical circuit or component failure. Thus, the presently described filter will only pass an input signal having the preselected frequency and produce an output signal during the presence of an input signal having the preselected frequency and in the absence of a critical circuit or component failure.

The foregoing object and other attendant features and advantages will be more readily appreciated as the subject invention becomes better understood by reference to the following detailed description when considered in conjunction with the accompanying drawing, in which the single FIGURE is a schematic diagram of the filter circuit embodying the invention.

In a speed control system for railroad as well as mass and/or rapid transit operations, an electronic band-pass filter would generally form a part of the vehicle-carried apparatus. For example, in a cab signaling speed control system, the cab signals are received from the rails and are applied to the cab signaling receiver for processing. By comparing the decoded speed command signal taken with the actual vehicle speed signal produced by an axle driven generator, it is possible to determine whether a vehicle is proceeding at the appropriate authorized speed for any given section of track. In such operations, it is mandatory that any overspeed condition be immediately detected and that the necessary measures, such as braking, be instituted to correct the situation. A further requirement of such operation entails that under no circumstance should a critical circuit or component failure simulate a true condition. Thus, every vital circuit including filter circuits of the vehicle-carried apparatus must operate in a fail-safe fashion. Further, since a separate filter circuit is employed for detecting each of the different frequencies of the various speed command signals, it is required that each filter only respond to its particular frequency. That is, the electronic filter should not be capable of passing signals having frequencies other than the signal of the preselected or particular frequency. Such operation is necessary in order to insure that it is impossible to produce an erroneous output which may simulate a less restrictive speed command than the actual speed command signal being received from the rails.

Referring to the single FIGURE of the drawing, there is shown an improved low frequency active band-pass filter circuit which is generally characterized by the numeral 1. Let us assume for the purpose of convenience that the circuit parameters and characteristics of the electronic band-pass filter 1 have been chosen or selected such that the circuit will pass a signal having a frequency of 2 hertz. Thus, an output signal should appear across terminals 2a and 2b when and only when a 2 hertz signal is present on input terminals 3a and 3b and a critical circuit or component failure is not present in the circuit. As shown, a high impedance resistor R1 interconnects the input terminal 3a to junction J1 of a parallel or twin-T resistance-capacitance network T-T. The twin-T circuit T-T is preferably an unbalanced symmetrical network consisting of resistors R2, R3, and R4 and capacitors C1, C2, and C3. As shown, resistor R2 and capacitors C2 and C3 form one-Tee of the network T-T while capacitor C1 and resistors R3 and R4 form the scond-Tee of the network T-T. In viewing the drawing, it will be noted that the upper terminal, namely, junction J1, of resistor R2 is connected to the junction J2, the common point between the plates of capacitors C2 and C3 while the lower terminal of resistor R2 is connected to the common lead 4 extending between terminals 2b and 3b. As shown, the upper plate of capacitor C1 is connected to the junction J3 which is the end of the one lead of resistor R4. The end of one lead of resistor R3 is connected to the intermediate junction J3' of the end of the one lead of resistor R4 to form a Kelvin connection, the purpose of which will be described hereinafter. The lower plate of capacitor C1 is connected to the common lead L1. The remote plate of capacitor C2 is connected to the other end of the lead of resistor R3 to form junction J4. The end of one lead of resistor R8 is connected to the intermediate junction J4' of the end of the resistor R3 to form a Kelvin connection as will be described in detail hereinafter. The remote plate of capacitor C3 is connected to the base electrode of transistor Q5 while the remote terminal of resistor R4 is connected to the emitter electrode of transistor Q5, the purpose of which will be described hereinafter.

In the instant case, the twin-T network T-T is symmetrical in that the parameters of capacitor C2 and capacitor C3 are equal, and the resistors R3 and R4 have identical values. Further, in the present case the parallel-T network T-T is unbalanced from the standpoint that resistive value of resistor R2 is not an integral factor of resistances R3 or R4, and that capacitive value of capacitors C2 or C3 is not an integral factor of capacitance C1. It has been found that a twin-T network can have the values of these parameters selected such that it has a unique characteristic that at the center frequency, namely, 2 hertz, the signal undergoes a 180° phase shift in passing from the input to the output. While the twin-T network T-T itself will pass signals of other frequencies, the network will provide a phase shift which is less than 180° and may be less than 90°. At zero (0) and infinite frequencies, zero (0) phase shift takes place while at all other frequencies the phase angle follows a rising and decaying curve exponential toward and from ±90° as the frequencies approach and recede from the center frequency. Thus, the unique phase inversion of imperfectly nulled twin-T network T-T permits its usage in a positive feedback type of band-pass amplifier circuit, as will be described presently.

As will be more readily apparent hereinafter, the band-pass amplifier filter 1 is preferably composed of a single voltage gain stage comprising an active element, namely, NPN transistor Q1. As shown, the NPN transistor Q1 includes an emitter electrode $e1$, a collector electrode $c1$, and a base electrode $b1$. The collector electrode $c1$ of transistor Q1 is directly connected to the remote plate of capacitor C3 while its emitter $e1$ is connected to the common lead L1 through resistor R5. The base electrode $b1$ of transistor Q1 is connected to the junction J5 formed between the common terminals of resistor R6 and resistor R7 and bypass capacitor C4. The lower terminal of resistor R6 is connected to the common lead L1 while the upper terminal of resistor R7 is connected to the output of a two stage Darlington circuit configuration. The Darlington configuration includes a pair of cascaded NPN transistors Q2 and Q3, each having an emitter, a collector and a base electrode. As shown, the emitter output electrode $e2$ is connected to the upper end of resistor R7 while the collector electrode $c2$ is directly connected to the positive terminal +V of a suitable d.c. power supply (not shown). The base electrode $b2$ of transistor Q2 is directly connected to the emitter $e3$ of transistor Q3. As shown, the collector electrode $c3$ of transistor Q3 is also directly connected to the positive terminal +V of the supply voltage. The base electrode $b3$ is electrically connected to the Kelvin connection which is common to junction J4 of capacitor C2 and resistor R3 by resistor R8. Thus, a feedback loop or path is provided from the collector output electrode $c1$ to the base input electrode $b1$ of the amplifier gain stage comprising transistor Q1. In effect, the feedback loop is completed from collector electrode $c1$ through the twin-T network T-T, through the resistor R8, through the base and emitter electrodes of transistors Q2 and Q3 of the Darlington circuit, through the resistor R7, to junction J5 and through the conductor or lead to base electrode $b2$.

A current source including transistor Q4 is arranged to provide a constant current to the collector electrode $c1$ of transistor Q1. As shown, the collector electrode $c4$ of transistor Q4 is directly connected to collector electrode $c1$ of transistor Q1. The emitter electrode $e4$ and the base electrode $b4$ of transistor Q4 are connected to the positive terminal +V by resistors R9 and R10, respectively. The resistors R10 and R11 form a voltage dividing network and the base electrode $b4$ is connected to the junction thereof to provide the necessary biasing and supply voltages for transistor Q4. An isolation circuit is coupled between the remote end of capacitor C3 and resistor R4. The isolation circuit includes the NPN transistor Q5 connected in a common-collector configuration or emitter-follower stage. The noninverting emitter-follower stage including the transistor Q5 is coupled to the output of the amplifying transistor Q1. As shown, base electrode $b5$ is directly connected to the collector electrode $c1$ of transistor Q1 while the collector electrode $c5$ of transistor Q5 is directly connected to the positive supply voltage +V. The emitter electrode $e5$ of transistor Q5 is directly connected to the output terminal $2a$.

In describing the operation, it will be initially assumed that the input signal appearing across terminals $3a$ and $3b$ is at center frequency, namely 2 hertz, and that the band-pass filtering circuit 1 is intact and operating in a proper manner. It will be appreciated that in addition to increasing the amplitude of the input signal, the common-emitter gain transistor Q1 inverts the incoming signal so that the signal appearing on the collector electrode $c1$ is 180° out of phase with the signal applied to base electrode $b1$. Thus, the 180° phase shift of the common-emitter configuration along with the 180° phase shift produced by the twin-T network insures that positive feedback occurs at the preselected center frequency, in this case, 2 hertz. The center frequency signals developed on collector electrode $c1$ are applied to the base electrode $b5$ of the emitter follower stage Q5 and appear on the output emitter electrode $e5$. Accordingly, the center frequency signal appearing across terminals $3a$ and $3b$ is reinforced by regenerative feedback and the gain of the amplifier transistor Q1 insures that a sufficient level of output voltage is produced across terminals $2a$ and $2b$.

Further, it will be appreciated that the gain of the feedback loop must be less than unity in order to preclude unwanted spurious oscillations to be produced during the absence of a 2 hertz signal on input terminals $3a$ and $3b$. That is, if sufficient attenuation does not occur in the feedback loop, the circuit would assume a condition of oscillations in which an erroneous output signal having a center frequency of 2 hertz will appear across the output terminals $2a$ and $2b$ even during the absence of a 2 hertz signal on terminals $3a$ and $3b$. In order to preclude such adverse oscillator type of operation, the gain of the feedback loop is designed to be less than unity and it will remain less than unity in spite of any circuit or component failure. It will be noted that the loop gain is the sum of the gain of the twin-T network times the gain of the common-emitter amplifier times any other gain in the feedback loop. In practice, the gain of the amplifier Q1 is X while the gain of the twin-T network is $1/(X+Y)$ for a total gain of less than unity. The Darlington transistor circuit is arranged in an emitter-follower configuration so that the voltage gain is slightly less than unity so that the overall gain of the loop is less than unity. It will be appreciated that the gain of the common-emitter amplifier Q1 is the ratio of the collector load impedance over the impedance of the emitter load resistor R5.

In the previous filtering arrangement of applicant's U.S. Pat. No. 3,725,802, the series resistance branch of the twin-T network and associated impedances effectively represented part of the collector load of the amplifying transistor Q1. It has been found that a poor connection or cold solder joint could effectively increase the value of the series resistance branch thereby resulting in an increase in the gain of the amplifying transistor Q1 which could result in spurious oscillations. In order to eliminate such possible adverse operation, it has been found advisable to employ special precautionary measures for each resistor of the series resistance branch of the R-C twin-T network T-T. A poor connection or cold solder joint is prevented from increasing the resistive value of resistor R3 due to the unique employment of the Kelvin connections on each lead thereof. Since junction J4 is the end of the lead of resistor R3 and the end of the lead of capacitor C2, a poor connection is reflected as an added impedance to the capacitor C2 rather than to the resistor R3. Likewise, a poor or cold solder joint at junction J4' is added to the resistance of resistor R8 rather than resistor R3. Similarly, the resistance of junction J3 is added to the impedance of capacitor C1 while the resistance of junction J3' is combined with the resistance R4 and not added to the resistor R3. The emitter-follower stage including transistor Q5 effectively isolates the resistor R4 from the collector load of transistor Q1. Thus, the collector load impedance is effectively the impedance of the capacitor C3 plus the impedances of the associated elements. It will be appreciated that when transistor Q5 is conducting there is little, if any, signal voltage between the base and emitter electrodes $b5$–$c5$ so that the remote ends of capacitor C3 and resistor R4 are effectively connected together thereby forming a common point with output terminal $2a$. Thus, an increase in resistance of the series resistive branch of the twin-T network does not adversely effect the collector load impedance of the amplifying transistor Q1 due to the isolation of the emitter-follower stage.

Let us now assume that the 2 hertz input signal is no longer applied to input terminals $3a$ and $3b$ but that a signal having a frequency other than the center frequency is present on input terminals $3a$ and $3b$. Under this condition, the off-center frequency signal undergoes a 180° inversion due to the common-emmiter amplifier transistor Q1. However, the twin-T network fails to invert the off-center frequency signal so that the feedback signal effectively opposes the signal appearing on terminals $3a$ and $3b$. Thus, degeneration or negative feedback occurs at all frequencies other than the center frequency, namely, 2 hertz. Accordingly, an erroneous output is incapable of being produced by the presence of signals other than the 2 hertz signal on input terminals $3a$ and $3b$.

As previously mentioned, the presently described active electronic band-pass filter circuit operates in a fail-safe manner in that no critical circuit or component failure is capable of producing a false output across terminals $2a$ and $2b$. To insure such an operation, it is necessary to take certain precautionary measures in regard to circuit design as well as to the selection of components. For example, the resistors employed in the circuit are preferably constructed of a carbon composition which will insure that these elements are incapable of becoming short-circuited. Thus, the input signals are assured of being attenuated a given amount so that subsequent amplification is necessary in order to produce any appreciable amount of output on terminals $2a$ and $2b$. The circuit is meticulously designed and laid out to ensure that leads in proximity of each other are incapable of touching each other to create a short circuit. With these safeguards and other precautionary measures being taken, it will be noted that no circuit or component failure is capable of producing an erroneous output across terminals $2a$ and $2b$. For example, an open-circuited or short-circuited circuit element will either destroy the necessary circuit amplifying characteristics or derange the d.c. biasing conditions of the amplifier. If the gain amplifier transistor Q1 becomes either open-circuited or short-circuited, the amplifying characteristics of the stage are destroyed so that the circuit losses can not be overcome. An open condition of transistor Q4 interrupts the current flow to the collector of transistor Q1. The opening of transistors Q2 and Q3 interrupts the feedback loop so that no feedback signal is available for the amplifying transistor Q1. The opening of resistor R1 completely removes any input signal to the band-pass filter circuit 1. The opening of transistor Q5 interrupts the circuit between the collector electrode $c1$ of the amplifying transistor Q1 and the output terminal $2a$. The shorting of the base-emitter electrodes of transistor Q5 lowers the load impedance of the amplifying transistor Q1 due to the parallel connection which causes a decrease in the gain. The opening of other elements either interrupts the feedback loop or removes the input signal and the necessary d.c. biasing to the fail-safe band-pass filter circuit 1. Further, the use of positive feedback ensures that the opening of the feedback loop causes degeneration rather than regeneration which would be the case if negative feedback was employed. That is, negative feedback would allow regeneration at all signal frequencies and thus would result in an unsafe condition during an open circuit failure.

While my invention has been described with reference to a vehicle speed control system for mass and/or rapid transit systems, it should be understood that the fail-safe electronic band-pass filter circuit may be used in other applications which require the vitality herein described. That is, it is readily evident that this invention is not limited thereto but may be employed in other various systems and apparatus, such as logic circuitry which require the security and safety inherently present in this invention. In addition, the presently described filter circuit may be used in any railroad, industrial, commercial as well as other environmental places where similar needs and conditions exist.

In addition, it is readily understood that the complementary type of the transistors may be employed in place of those shown and described by simply reversing the polarity of the d.c. supply voltage, as is well known. Further, it will be appreciated that the input signal may be applied to various other points in the circuit rather than being applied to the junction point J1. However, in changing the input point, it is necessary to insure that a readily accessible low impedance circuit path is not capable of being established between the input and output during certain types of failures. It is further understood that other values of the resistors and capacitor can be combined to make up the parallel or twin-T network which may be selected in accordance with the characteristics that are desired to be obtained. That is, imperfect nulling at a frequency of 2 hertz may also be obtained by using other resistances and capacitances values, and imperfect nulling is also obtainable at other signal frequencies with other resistors and capacitors.

It will be apparent that other modifications and changes can be made to the presently described invention and it is therefore understood that all changes, equivalents and modifications within the spirit and scope of the present invention are herein meant to be included in the appended claims.

Having now described the invention what I claim as new and desire to secure by Letters Patent is:

1. A fail-safe electronic filter for passing a signal having a preselected frequency comprising, an amplifier having an input and an output circuit, a feedback path including an R-C twin-T network connected from said output circuit to said input circuit of said amplifier, an isolation circuit connected between said output circuit of said amplifier and said R-C twin-T network to prevent an increase in the gain of said amplifier due to an increase of resistance in said R-C twin-T network, said R-C twin-T network is imperfectly nulled to provide regeneration at said preselected frequency and to provide degeneration at all other frequencies from said output circuit to said input circuit of said amplifier so that an output signal is only available on an output terminal during the presence of said preselected frequency signal at said input circuit of said amplifier and in the absence of a critical component or circuit failure in the fail-safe electronic filter.

2. A fail-safe electronic filter as defined in claim 1, wherein said isolation circuit is a transistor connected as an emitter-follower.

3. A fail-safe electronic filter as defined in claim 1, wherein said isolation circuit is a common-collector transistor amplifier.

4. A fail-safe electronic filter as defined in claim 1, wherein said isolation circuit includes an amplifying stage having its input connected to the output circuit of said amplifier and having its output connected to said output terminal.

5. A fail-safe electronic filter as defined in claim 1, wherein said isolation circuit includes a single transistor stage connected in a common collector configuration and said amplifier is a single transistor stage connected in a common-emitter configuration.

6. A fail-safe electronic filter as defined in claim 1, wherein said isolation circuit includes an NPN transistor having its base-emitter electrodes connected between said output circuit of said amplifier and said R-C twin-T network.

7. A fail-safe electronic circuit as defined in claim 1, wherein said isolation circuit isolates the series resistance branch of said R-C twin-T network from said output circuit of said amplifier.

8. A fail-safe electronic filter as defined in claim 1, wherein a Kelvin connection is utilized in the series resistance branch of said R-C twin-T network to preclude a poor connection from increasing the resistance of the series resistance branch of said R-C twin-T network.

* * * * *